(12) United States Patent
Huang (10) Patent No.: US 8,866,281 B2
(45) Date of Patent: Oct. 21, 2014

(54) THREE-DIMENSIONAL INTEGRATED CIRCUITS AND FABRICATION THEREOF

(75) Inventor: Tsai-Yu Huang, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 132 days.

(21) Appl. No.: 13/553,725

(22) Filed: Jul. 19, 2012

(65) Prior Publication Data

US 2014/0021599 A1   Jan. 23, 2014

(51) Int. Cl.
*H01L 23/02* (2006.01)

(52) U.S. Cl.
USPC ............ 257/686; 257/685; 257/737; 257/774

(58) Field of Classification Search
CPC .............................. H01L 23/48; H01L 21/768
USPC .................................. 257/685, 686, 774, 737
See application file for complete search history.

(56) References Cited

U.S. PATENT DOCUMENTS

| | | | |
|---|---|---|---|
| 2005/0170600 A1* | 8/2005 | Fukuzo | 438/396 |
| 2009/0039492 A1* | 2/2009 | Kang et al. | 257/686 |
| 2010/0213600 A1* | 8/2010 | Lau et al. | 257/693 |
| 2013/0105939 A1* | 5/2013 | Domae | 257/528 |

FOREIGN PATENT DOCUMENTS

WO    WO 2012/086100    *   6/2012   .......... H01L 23/5384

* cited by examiner

*Primary Examiner* — Long K Tran (57) ABSTRACT

A three-dimensional integrated circuit is disclosed, including a first interposer including through substrate vias (TSV) therein and circuits thereon; a plurality of first active dies disposed on a first side of the first interposer, a plurality of first intermediate interposers, each including through substrate vias (TSV), disposed on the first side of the first interposer, and a second interposer including through substrate vias (TSV) therein and circuits thereon supported by the first intermediate interposers.

19 Claims, 8 Drawing Sheets

THREE-DIMENSIONAL INTEGRATED CIRCUITS AND FABRICATION THEREOF

BACKGROUND OF THE INVENTION

1. Field of the Invention

This disclosure relates generally to integrated circuits, and more particularly to three-dimensional integrated circuits (3DICs) comprising interposers and the method of forming the same.

2. Description of the Related Art

Since the invention of integrated circuits, the semiconductor industry has experienced continuous rapid growth due to constant improvements in the integration density of various electronic components (i.e., transistors, diodes, resistors, capacitors, etc.). For the most part, these improvements in integration density have come from repeated reductions in minimum feature sizes, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required. An additional limitation comes from the significant increase in the number and length of interconnections between devices as the number of devices increases. When the number and length of interconnections increase, both circuit RC delay and power consumption increase.

Three-dimensional integrated circuits (3DICs) were thus formed, wherein two dies may be stacked, with through-silicon vias (TSVs) formed in one of the dies to connect the other die to a package substrate. TSVs formed in active dies, however, occupy applicable active areas, thus resulting in area penalty. Therefore, there are requirements to form 3D ICs without TSVs formed in active dies.

BRIEF SUMMARY OF INVENTION

The invention provides a three-dimensional integrated circuit, comprising a first interposer comprising through substrate vias (TSV) therein and circuits thereon; a plurality of first active dies disposed on a first side of the first interposer, a plurality of first intermediate interposers, each comprising through substrate vias (TSV), disposed on the first side of the first interposer, and a second interposer comprising through substrate vias (TSV) therein and circuits thereon supported by the first intermediate interposers.

The invention further comprises a method for forming a three-dimensional integrated circuit, comprising providing a first interposer comprising through substrate vias (TSV) therein and circuits thereon, bumping a plurality of first active dies to a first side of the first interposer, bumping a plurality of first intermediate interposers, each comprising through substrate vias (TSV), to the first side of the first interposer, and bumping a second interposer comprising through substrate vias (TSV) therein and circuits thereon to the first intermediate interposers.

BRIEF DESCRIPTION OF DRAWINGS

The invention can be more fully understood by reading the subsequent detailed description and examples with references made to the accompanying drawings, wherein.

DETAILED DESCRIPTION OF INVENTION

It is understood that specific embodiments are provided as examples to teach the broader inventive concept, and one of ordinary skill in the art can easily apply the teaching of the present disclosure to other methods or apparatus. The following discussion is only used to illustrate the invention, not limit the invention.

Figure 1A:
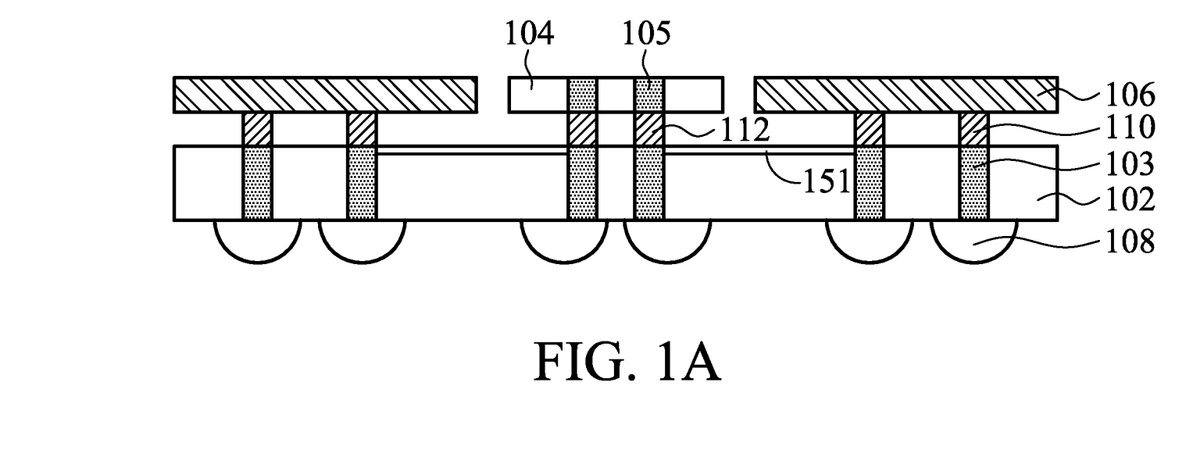
FIGS. 1A~FIG. 1D show intermediate stages of a method for forming a three-dimensional integrated circuits (3D IC) comprising interposers of an embodiment of the invention

A method for forming a three-dimensional integrated circuits (3D IC) comprising interposers of an embodiment of the invention is illustrated in accordance with FIG. 1A~FIG. 1D. 1C. Referring to FIG. 1A, a first interposer 102 suitable for integrated circuit manufacturing is provided. The first interposer 102 may be formed of a semiconductor material, such as silicon, silicon germanium, silicon carbide, gallium arsenide, or other commonly used semiconductor materials. Alternatively, the first interposer 102 can be formed of glass. Preferably, the first interposer 102 is formed of silicon. The first interposer 102 comprises through substrate vias (TSV) 103 formed therein and circuits 151 formed thereon. The first interposer 102 is substantially free from integrated circuit devices, including active devices, such as transistors and diodes. Furthermore, the first interposer 102 may include, or may be free from, passive devices, such as capacitors, resistors, inductors, varactors, and/or the like. First active dies 106 are bonded to the first side of the first interposers 102 through the first bumps 110. The first active dies 106 may comprise no TSV therein. In an embodiment, the first bump 110 can be aligned to the TSVs 103 in the interposer 106. The first active dies 106 may comprise active devices and/or passive devices formed thereon or therein. For example, transistors, diodes, capacitors, resistors, inductors, varactors and/or the like can be formed on or in the first active dies 106. First intermediate interposers 104 comprising TSVs 105 are bonded to the first side of the first interposer 102 through the second bumps 112. The first intermediate interposers 104 may have a size smaller than that of the first interposer 102. Solder bumps 108 are bonded to the second side of the first interposer 102, wherein one of the solder bumps may be aligned to one of the TSVs 103 in the first interposer 102.

Figure 1B:
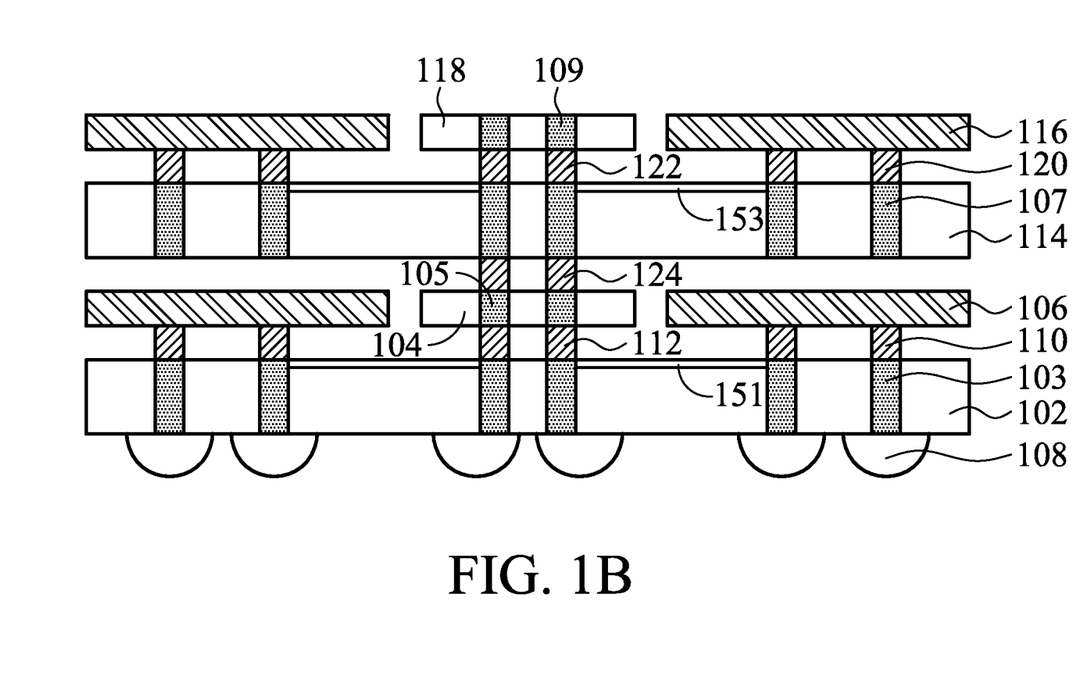

Next, referring to FIG. 1B, a second interposer 114 suitable for integrated circuit manufacturing is provided. The second interposer 114 may be formed of a semiconductor material, such as silicon, silicon germanium, silicon carbide, gallium arsenide, or other commonly used semiconductor materials. Alternatively, the second interposer 114 can be formed of glass. Preferably, the second interposer 114 is formed of silicon. Likewise, the second interposer 114 comprises through substrate vias (TSV) 107 formed therein and circuits 153 formed thereon. Second active dies 116 are bonded to a first side of the second interposers 114 through the third bumps 120. The second active dies 116 may comprise no TSV therein. The second active dies 116 may comprise active devices and/or passive devices formed thereon or therein. For example, transistors, diodes, capacitors, resistors, inductors, varactors and/or the like can be formed on or in the second active dies 116. Furthermore, second intermediate interposers 118 comprising TSVs 109 are bonded to the first side of the second interposer 114 through the fourth bumps 122. The second intermediate interposers 118 may have a size smaller than that of the second interposer 114. Thereafter, the second interposer 114 together with the second active dies 116 and the second intermediate interposers 118 are bonded to the first intermediate interposers 104 through the fifth bumps 124. As shown in FIG. 1B, the first intermediate interposer 104 can be used to support the second interposer 114 and electrical signals can be transported from the first active dies 106 to the second active dies 116 through the circuit 151 on the first interposer 102, the TSVs 105 in the first intermediate interposer 104, the TSVs 107 in the second interposer 114 and the circuits 153 on the second interposer 114.

Figure 1C:
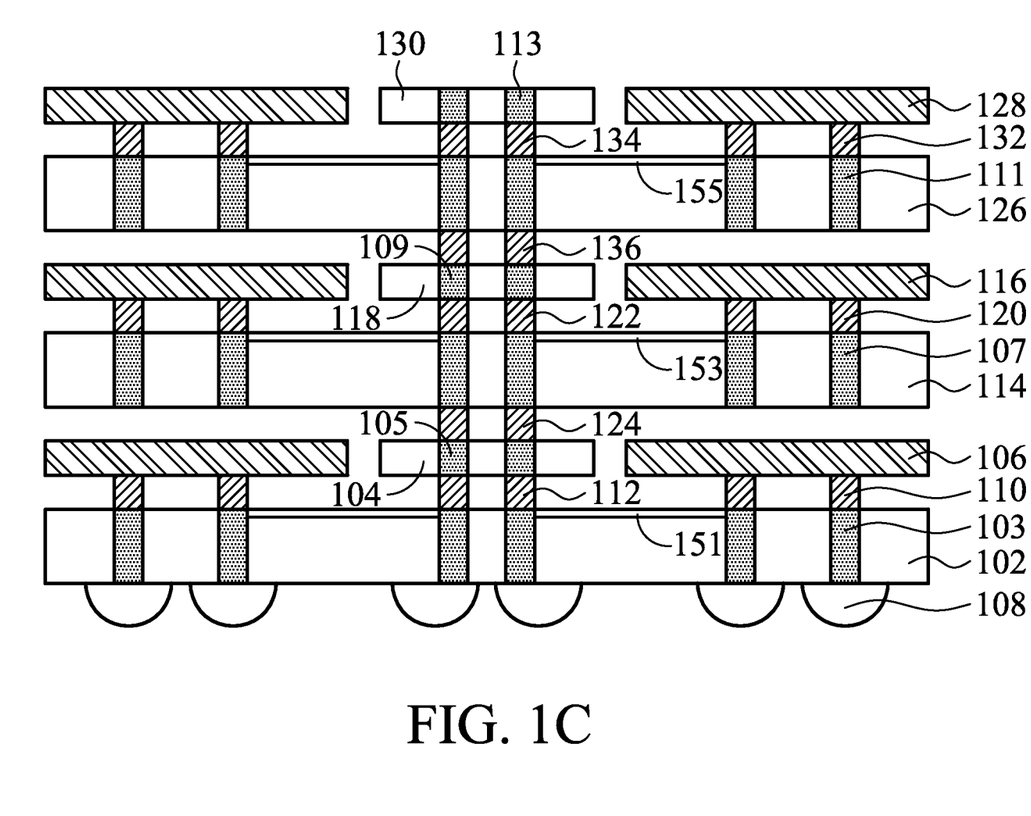

Thereafter, referring to FIG. 1C, a third interposer 126 suitable for integrated circuit manufacturing is provided. The third interposer 126 may be formed of a semiconductor material, such as silicon, silicon germanium, silicon carbide, gallium arsenide, or other commonly used semiconductor materials. Alternatively, the third interposer 126 can be formed of glass. Preferably, the third interposer 126 is formed of silicon. Likewise, the third interposer 126 comprises through substrate vias (TSV) 111 formed therein and circuits 155 formed thereon. Third active dies 128 are bonded to a first side of the third interposers 126 through the sixth bumps 132. The third active dies 128 may comprise no TSV therein. The third active dies 128 may comprise active devices and/or passive devices formed thereon or therein. For example, transistors, diodes, capacitors, resistors, inductors, varactors and/or the like can be formed on or in the third active dies 128. Furthermore, third intermediate interposers 130 comprising TSVs 113 are bonded to the first side of the third interposer 126 through the seventh bumps 134. The third intermediate interposers 130 may have a size smaller than that of the third interposer 126. Thereafter, the third interposer 126 together with the third active dies 128 and the third intermediate interposers 130 are bonded to the second intermediate interposers 118 through the eighth bumps 136. As shown in FIG. 1C, the second intermediate interposer 118 can be used to support the third interposer 126 and electrical signals can be transported from the second active dies 116 to the third active dies 128 through the circuit 153 on the second interposer 114, the TSVs 109 in the second intermediate interposer 118, the TSVs 111 in the third interposer 126 and the circuits 155 on the third interposer 126.

Figure 1D:
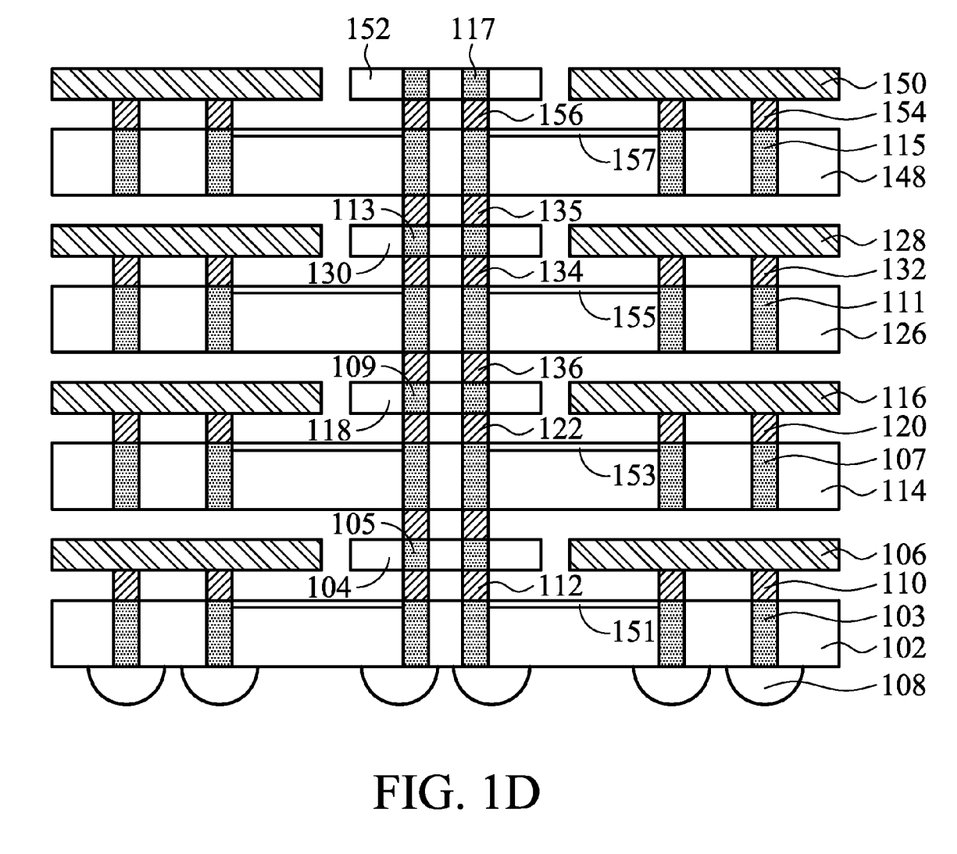

Next, referring to FIG. 1D, a fourth interposer 148 suitable for integrated circuit manufacturing is provided. The fourth interposer 148 may be formed of a semiconductor material, such as silicon, silicon germanium, silicon carbide, gallium arsenide, or other commonly used semiconductor materials. Alternatively, the fourth interposer 148 can be formed of glass. Preferably, the fourth interposer 148 is formed of silicon. Likewise, the fourth interposer 148 comprises through substrate vias (TSV) 115 formed therein and circuits 157 formed thereon. Fourth active dies 150 are bonded to a first side of the fourth interposers 148 through the ninth bumps 154. The fourth active dies 150 may comprise no TSV therein. The fourth active dies 150 may comprise active devices and/or passive devices formed thereon or therein. For example, transistors, diodes, capacitors, resistors, inductors, varactors and/or the like can be formed on or in the fourth active dies 150. Furthermore, fourth intermediate interposers 152 are bonded to the first side of the fourth interposer 148 through the tenth bumps 156. The fourth intermediate interposers 152 may have a size smaller than that of the fourth interposer 148. Thereafter, the fourth interposer 148 together with the fourth active dies 150 and the fourth intermediate interposers 152 are bonded to the third intermediate interposers 130 through the eighth bumps 135. As shown in FIG. 1D, the third intermediate interposer 130 can be used to support the fourth interposer 148 and electrical signals can be transported from the third active dies 128 to the fourth active dies 150 through the circuit 155 on the third interposer 126, the TSVs 113 in the third intermediate interposer 130, the TSVs 115 in the fourth interposer 148 and the circuits 157 on the fourth interposer 148.

With the interposers and the intermediate interposers, 3D integrated circuits can be formed without forming through substrate vias in the active dies. Therefore, applicable active areas of active dies can be increased and issues generated from forming TSVs in active dies can eliminated.

Figure 2:
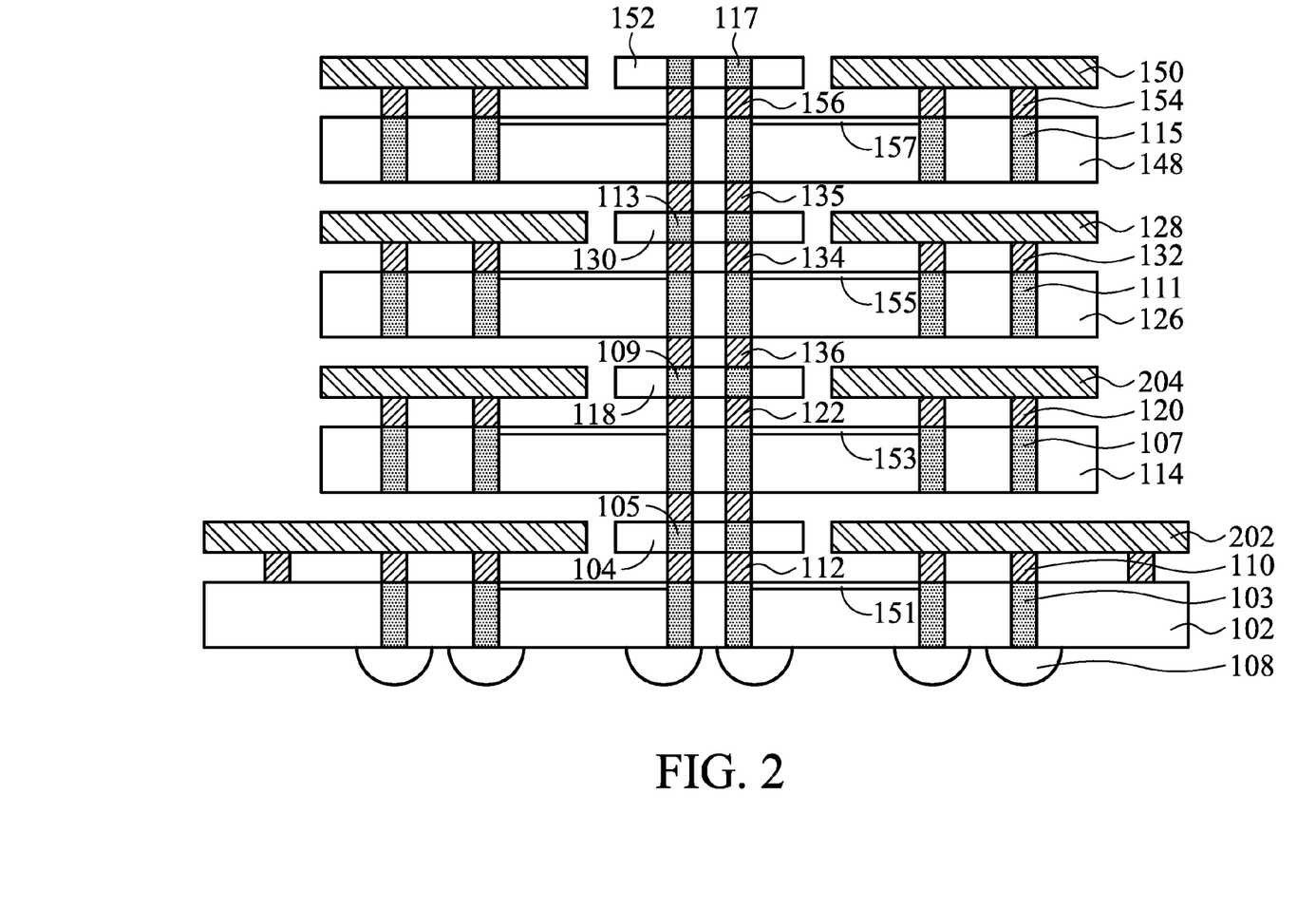
FIG. 2 shows a cross section of a method for forming a three-dimensional integrated circuits (3D IC) comprising interposers of another embodiment of the invention

FIG. 2 shows a three-dimensional integrated circuit (3D IC) comprising interposers of another embodiment of the invention. The difference between the 3D ICs in FIG. 1D and that in FIG. 2 is that the first active dies 202 of the 3D IC shown in FIG. 2 have different functions and sizes when compared to the second active dies 204. For example, as shown in FIG. 2, the size of the first active dies 202 is larger than size of the second active dies 204, and the first active dies 202 may be logic devices, but the second active dies 204 may be memory devices.

Figure 3A:
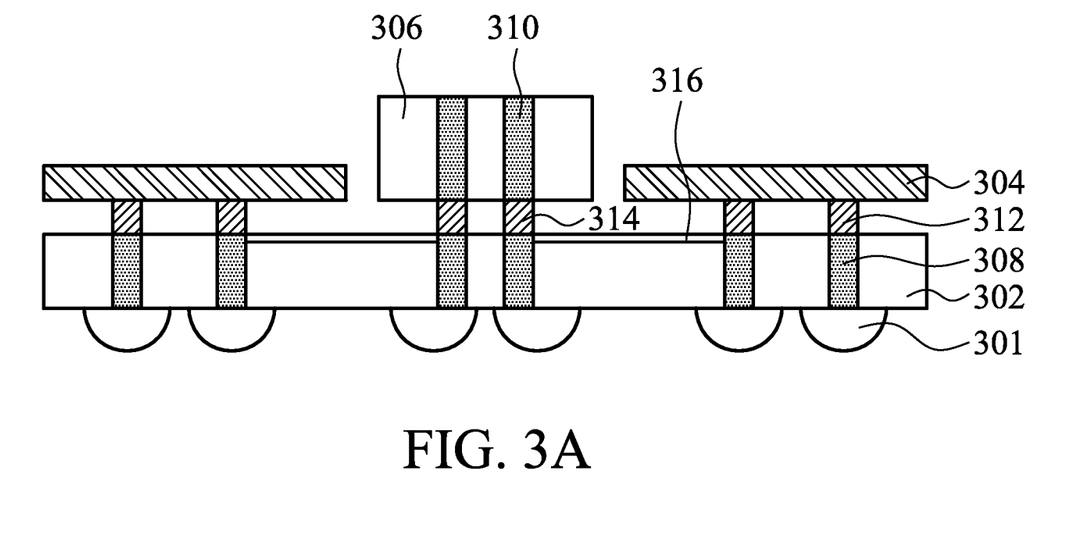
FIGS. 3A~FIG. 3C show intermediate stages of a method for forming a three-dimensional integrated circuits (3D IC) comprising interposers of yet another embodiment of the invention
Figure 3B:
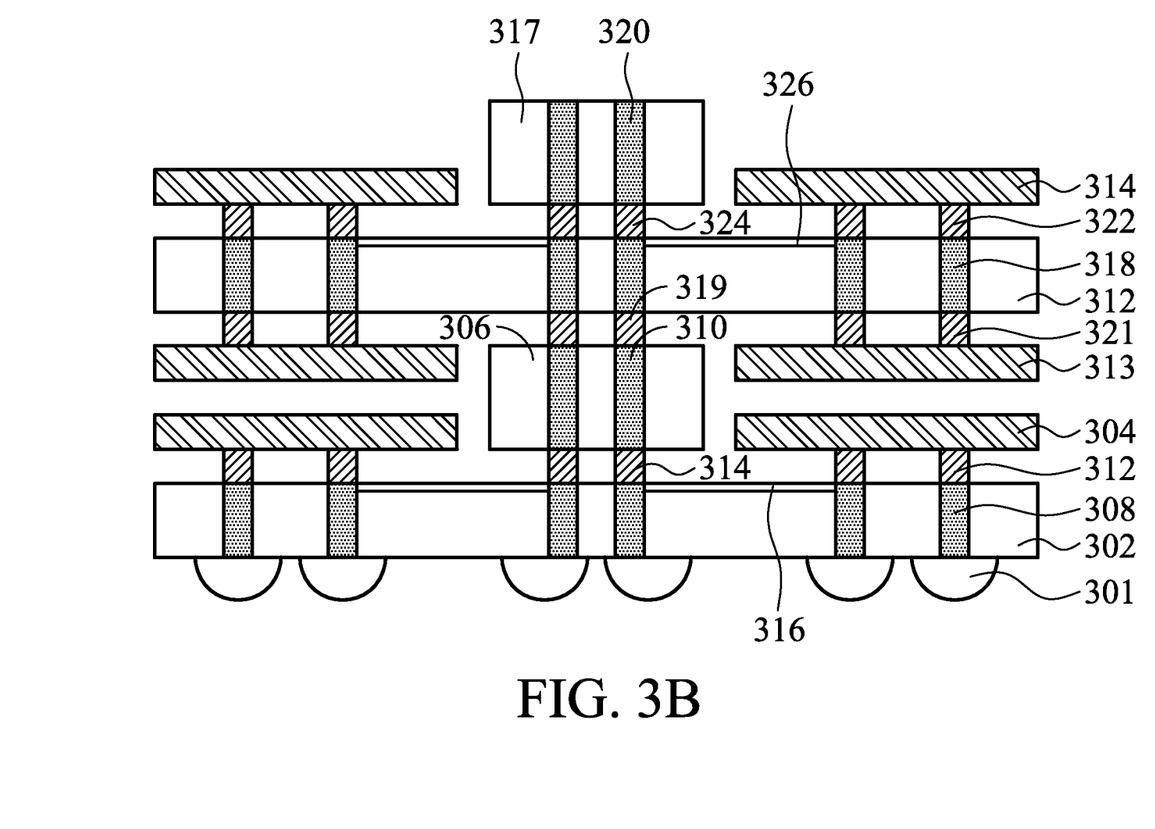
Figure 3C:
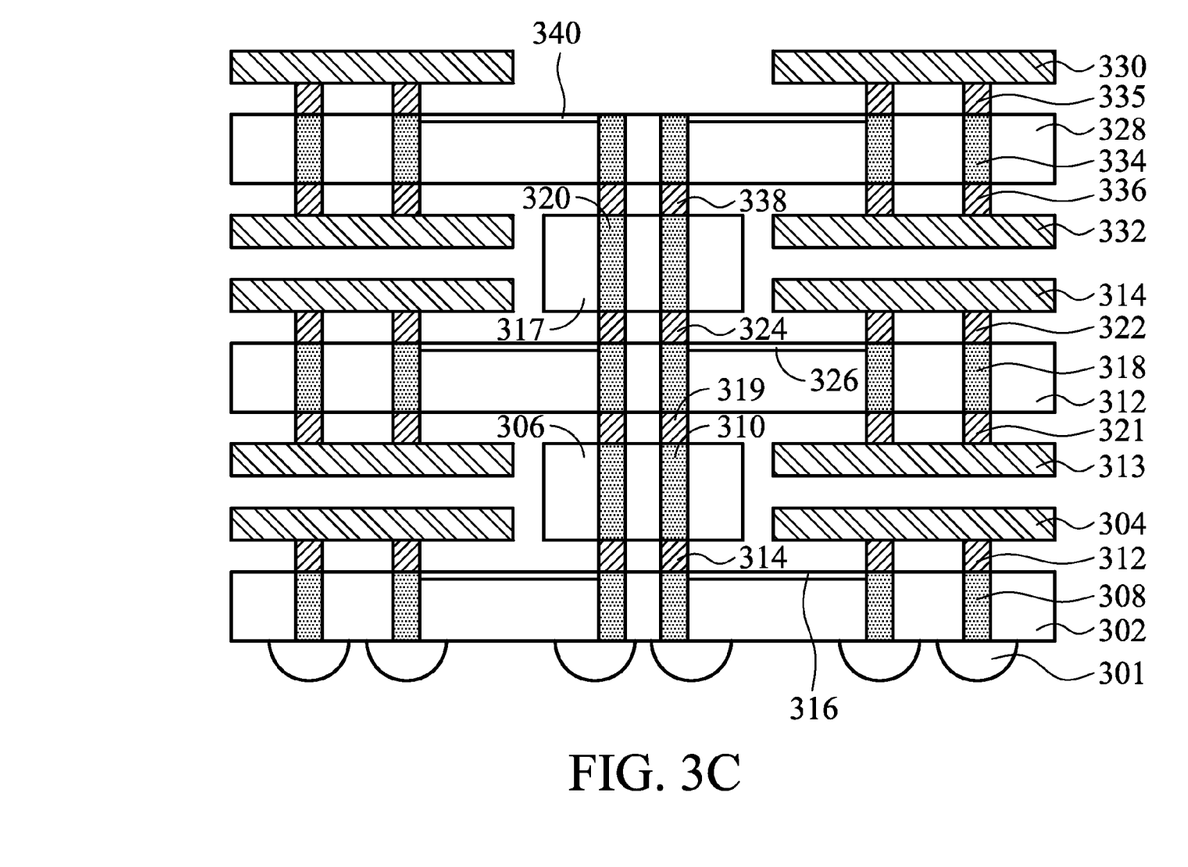

A method for forming a three-dimensional integrated circuits (3D IC) comprising interposers in yet another embodiment of the invention is illustrated in accordance with FIG. 3A~FIG. 3C. Referring to FIG. 3A, a first interposer 302 suitable for integrated circuit manufacturing is provided. The first interposer 302 may be formed of a semiconductor material, such as silicon, silicon germanium, silicon carbide, gallium arsenide, or other commonly used semiconductor materials. Alternatively, the first interposer 302 can be formed of glass. Preferably, the first interposer 302 is formed of silicon. The first interposer 302 comprises through substrate vias (TSV) 308 formed therein and circuits 316 formed thereon. The first interposer 302 may be substantially free from integrated circuit devices, including active devices, such as transistors and diodes. Furthermore, the first interposer 302 may include, or may be free from, passive devices, such as capacitors, resistors, inductors, varactors, and/or the like. First active dies 304 are bonded to the first side of the first interposers 302 through the first bumps 312. In an embodiment, one of the first bumps 312 can be aligned to the corresponding TSV 308 in the interposer 302. Specifically, the first active dies 304 may comprise no TSV 308 therein. The first active dies 304 may comprise active devices and/or passive devices formed thereon or therein. For example, transistors, diodes, capacitors, resistors, inductors, varactors and/or the like can be formed on or in the first active dies 304. First intermediate interposers 306 comprising TSVs 310 are bonded to the first side of the first interposer 302 through the second bumps 314. The first intermediate interposers 306 may have a size smaller than that of the first interposer 302, and specifically, the first intermediate interposers 306 may have a thickness greater than the first active dies 304. Solder bumps 301 are bonded to the second side of the first interposer 302, wherein one of the solder bumps 301 can be aligned to one of the TSVs 308 in the first interposer 302.

Next, referring to FIG. 3B, a second interposer 312 suitable for integrated circuit manufacturing is provided. The second interposer 312 may be formed of a semiconductor material, such as silicon, silicon germanium, silicon carbide, gallium arsenide, or other commonly used semiconductor materials. Alternatively, the second interposer 312 can be formed of glass. Preferably, the second interposer 312 is formed of silicon. Likewise, the second interposer 312 comprises through substrate vias (TSV) 318 formed therein and circuits 326 formed thereon. Second active dies 314 are bonded to a first side of the second interposers 312 through the fourth bumps 321. Specifically, the second active dies 314 may comprise no TSV therein. The second active dies 314 may comprise active devices and/or passive devices formed thereon or therein. For example, transistors, diodes, capacitors, resistors, inductors, varactors and/or the like can be formed on or in the second active dies 314. Third active dies 313 are bonded to a second side of the second interposers 312 through the third bumps 322. Specifically, the third active dies 313 may comprise no TSV therein. Likewise, the third active dies 313 may comprise active devices and/or passive devices formed thereon or therein. For example, transistors, diodes, capacitors, resistors, inductors, varactors and/or the like can be formed on or in the third active dies 313. Second intermediate interposers 317 comprising TSVs 320 are bonded to the first side of the second interposer 312 through the fifth bumps 324. The second intermediate interposers 317 may have a size smaller than that of the second interposer 312, and greater thickness than the second active die 314.

Thereafter, the second interposer 312 together with the second active dies 314 and the second intermediate interposers 317 are bonded to the first intermediate interposers 306 through the sixth bumps 319. As shown in FIG. 3B, the first intermediate interposer 306 can be used to support the second interposer 312, and electrical signals can be transported from the first active dies 304 to the second active dies 314 and third active dies 313 through the circuit 316 on the first interposer 302, the TSVs 310 in the first intermediate interposer 306, the circuits 316 on the second interposer 312, and the TSVs in the second interposer 312.

Referring to FIG. 3C, a third interposer 328 suitable for integrated circuit manufacturing is provided. The third interposer 328 may be formed of a semiconductor material, such as silicon, silicon germanium, silicon carbide, gallium arsenide, or other commonly used semiconductor materials. Alternatively, the third interposer 328 can be formed of glass. Preferably, the third interposer 328 is formed of silicon. Likewise, the third interposer 328 comprises through substrate vias (TSV) 334 formed therein and circuits 340 formed thereon. Fourth active dies 330 are bonded to a first side of the third interposers 328 through the seventh bumps 335. Specifically, the fourth active dies 330 may comprise no TSV therein. The fourth active dies 330 may comprise active devices and/or passive devices formed thereon or therein. For example, transistors, diodes, capacitors, resistors, inductors, varactors and/or the like can be formed on or in the fourth active dies 330. Fifth active dies 332 are bonded to a second side of the third interposers 328 through the eighth bumps 336. The fifth active dies 332 may comprise no TSV therein. The third active dies 313 may comprise active devices and/or passive devices formed thereon or therein. For example, transistors, diodes, capacitors, resistors, inductors, varactors and/or the like can be formed on or in the fifth active dies 332.

Thereafter, the third interposer 328 together with the fourth active dies 330 and the fifth active dies 332 are bonded to the second intermediate interposers 317 through ninth bumps 338. As shown in FIG. 3C, the second intermediate interposers 317 can be used to support the third interposer 328, and electrical signals can be transported from the second active dies 314 to the fourth active dies 330 and fifth active dies 332 through the circuit 340 on the second interposer 312, the TSVs 320 in the second intermediate interposer 317, the circuits 340 on the third interposer 328, and the TSVs 334 in the third interposer 328.

The 3D integrated circuits of embodiments of the invention have advantages as follows. The 3D integrated circuits with the interposers and the intermediate interposers can be formed without forming through substrate vias in the active dies. Therefore, applicable active areas of active dies can be increased and issues generated from forming TSVs in active dies can eliminated.

While the invention has been described by way of example and in terms of the preferred embodiments, it is to be understood that the invention is not limited to the disclosed embodiments. It is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A three-dimensional integrated circuit, comprising: a first interposer comprising through substrate vias (TSV) therein and circuits on a first side of the first interposer;
    a plurality of first active dies arranged on the first side of the first interposer along a direction parallel to the first side;
    a plurality of first intermediate interposers, each comprising through substrate vias (TSV), disposed on the first side of the first interposer, wherein each of the plurality of first intermediate interposers is disposed between adjacent first active dies;
    solder bumps disposed on a second surface of the first interposer opposite to the first side of the first interposer, wherein one of the solder bumps, one of the through substrate vias in the first interposer and one of the through substrate vias in one of the plurality of first intermediate interposers are aligned with each other; and
    a second interposer comprising through substrate vias (TSV) therein and circuits thereon supported by the first intermediate interposers.

2. The three-dimensional integrated circuit as claimed in claim 1, further comprising a plurality of second active dies disposed on a first side of the second interposer.

3. The three-dimensional integrated circuit as claimed in claim 2, wherein the first active dies are electrically connected to the second active dies are through the circuits on the first interposer, the through substrate vias (TSV) in the first intermediate interposers, the through substrate vias (TSV) in the second interposer and the circuits on the second interposer.

4. The three-dimensional integrated circuit as claimed in claim 2, further comprising a plurality of second intermediate interposers, each comprising through substrate vias (TSV), disposed on the first side of the second interposer.

5. The three-dimensional integrated circuit as claimed in claim 4, further comprising a third interposer comprising through substrate vias (TSV) therein and circuits thereon supported by the second intermediate interposers.

6. The three-dimensional integrated circuit as claimed in claim 5, further comprising a plurality of third active dies and third intermediate interposers comprising through substrate vias (TSV) disposed on a first side of the third interposer.

7. The three-dimensional integrated circuit as claimed in claim 6, further comprising a fourth interposer comprising through substrate vias (TSV) therein and circuits thereon supported by the third intermediate interposers.

8. The three-dimensional integrated circuit as claimed in claim 7, further comprising a plurality of fourth active dies and fourth intermediate interposers comprising through substrate vias (TSV) disposed on a first side of the fourth interposer.

9. The three-dimensional integrated circuit as claimed in claim 1, wherein the first active dies and the second active dies have different functions.

10. The three-dimensional integrated circuit as claimed in claim 1, further comprising a plurality of second active dies disposed on the first side of the second interposer and a plurality of third active dies disposed on the second side of the second interposer.

11. The three-dimensional integrated circuit as claimed in claim 10, wherein thickness of the first intermediate interposers is greater than thickness of the first active dies.

12. The three-dimensional integrated circuit as claimed in claim 10, further comprising a plurality of second intermediate interposers disposed on the first side of the second interposer.

13. The three-dimensional integrated circuit as claimed in claim 12, further comprising a third interposer comprising through substrate vias (TSV) therein and circuits thereon supported by the second intermediate interposers.

14. The three-dimensional integrated circuit as claimed in claim 13, further comprising a plurality of fourth active dies disposed on a first side of the third interposer and a plurality of fifth active dies disposed on a second side of the third interposer.

15. A method for forming a three-dimensional integrated circuit, comprising:
   providing a first interposer comprising through substrate vias (TSV) therein and circuits on a first side of the first interposer;
   bumping a plurality of first active dies to the first side of the first interposer, wherein the plurality of first active dies are arranged along a direction parallel to the first side;
   bumping a plurality of first intermediate interposers, each comprising through substrate vias (TSV), to the first side of the first interposer, wherein the plurality of first intermediate interposers are disposed between adjacent first active dies;
   forming solder bumps on a second surface of the first interposer opposite to the first side of the first interposer, wherein one of the solder bumps, one of the through substrate vias in the first interposer and one of the through substrate vias in one of the plurality of first intermediate interposers are aligned with each other; and
   bumping a second interposer comprising through substrate vias (TSV) therein and circuits thereon to the first intermediate interposers.

16. The method for forming a three-dimensional integrated circuit as claimed in claim 15, further comprising bumping a plurality of second active dies and second intermediate interposers to the first side of the second interposer.

17. The method for forming a three-dimensional integrated circuit as claimed in claim 16, wherein the first active dies and the second active dies have different functions.

18. The method for forming a three-dimensional integrated circuit as claimed in claim 15, further comprising disposing a plurality of second active dies to a first side of the second interposer and a plurality of third active dies to a second side of the second interposer.

19. The method for forming a three-dimensional integrated circuit as claimed in claim 15, wherein thickness of the first intermediate interposers is greater than thickness of the first active dies.

* * * * *